(12) United States Patent
Zhang (10) Patent No.: US 11,271,059 B2
(45) Date of Patent: Mar. 8, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 226 days.

(21) Appl. No.: 16/652,540

(22) PCT Filed: Oct. 8, 2019

(86) PCT No.: PCT/CN2019/109924
§ 371 (c)(1),
(2) Date: Mar. 31, 2020

(87) PCT Pub. No.: WO2021/003863
PCT Pub. Date: Jan. 14, 2021

(65) Prior Publication Data
US 2021/0408145 A1    Dec. 30, 2021

(30) Foreign Application Priority Data

Jul. 8, 2019    (CN) .......................... 201910608301.5

(51) Int. Cl.
*H01L 27/32*    (2006.01)

(52) U.S. Cl.
CPC ........ *H01L 27/326* (2013.01); *H01L 27/3276* (2013.01)

(58) Field of Classification Search
CPC .......................... H01L 27/326; H01L 27/3276
See application file for complete search history.

(56) References Cited

U.S. PATENT DOCUMENTS

| 10,879,330 B1* | 12/2020 | Cui ..................... H01L 27/3276 |
| 10,962,843 B2* | 3/2021 | Wu ..................... G02F 1/136209 |
| 2019/0304356 A1 | 10/2019 | Ka et al. |
| 2019/0326364 A1* | 10/2019 | Chai .................... H01L 27/3288 |
| 2020/0380915 A1* | 12/2020 | Yoon ................... H01L 27/3262 |
| 2021/0265430 A1* | 8/2021 | Chang ................ H01L 27/3234 |

(Continued)

FOREIGN PATENT DOCUMENTS

| CN | 107886850 A | 4/2018 |
| CN | 109031832 A | 12/2018 |
| CN | 109541867 A | 3/2019 |

(Continued)

*Primary Examiner* — Douglas M Menz (57) ABSTRACT

The embodiment of this application discloses a display panel, the display panel includes a first display area, a second display area, and a non-display area; the non-display area and the second display area are disposed adjacent to each other; the first display area surrounds the second display area and the non-display area; the first display area includes at least one first pixel unit; and the second display area includes at least one second pixel unit, wherein an area of the at least one second pixel unit is less than an area of the at least one first pixel unit.

20 Claims, 4 Drawing Sheets

(56) References Cited

U.S. PATENT DOCUMENTS

2021/0335919 A1* 10/2021 Bai .................... H04M 1/02

FOREIGN PATENT DOCUMENTS

| CN | 109584779 | A | 4/2019 |
| CN | 109656070 | A | 4/2019 |
| CN | 109713024 | A | 5/2019 |
| EP | 3232431 | A1 | 10/2017 |

* cited by examiner

DISPLAY PANEL AND DISPLAY DEVICE

FIELD OF INVENTION

This invention relates to the field of display technologies, and in particular, to a display panel and a display device.

BACKGROUND OF INVENTION

At this stage, development of display technology is changing with each passing day, and the emergence of various screen technologies provides unlimited possibilities for electronic terminals. In particular, the rapid application of display technology represented by organic light-emitting diodes (OLEDs), and various mobile terminals with "full screen", "shaped screen", "speaker in screen", "under screen fingerprint", and the like as selling points have begun to be rapidly promoted. At this stage, major mobile phone and panel manufacturers have launched a number of products that use "full screen" as their selling point, but most of them still adopt the approximate full-screen design of "notched screen" and "water drop screen" because of the presence of a front camera. This is a last resort, a certain area must be retained for the front camera.

That is, display area ratio of current display panel is low.

Technical Problems

That is, display area ratio of current display panel is low.

Technical Solution

The embodiment of the present application provides a display panel, which can increase display area ratio of the display panel.

In order to solve the above problems, in a first aspect, the present application provides a display panel, including a first display area, a second display area, and a non-display area;

the non-display area and the second display area disposed adjacent to each other, the first display area surrounding the second display area and the non-display area, and the first display area including at least one first pixel unit, the second display area including at least one second pixel unit;

wherein an area of the second pixel unit is less than an area of the first pixel unit;

a center-to-center distance between two adjacent first pixel units is greater than a center-to-center distance between two adjacent second pixel units; and the second display area surrounds the non-display area, and the first display area surrounds the second display area.

Wherein the display panel includes a plurality of data lines and a plurality of scan lines, the plurality of scan lines are sequentially arranged along a first direction, the plurality of data lines are sequentially arranged along a second direction, a plurality of grid cells are formed by interlacing the plurality of data lines and the plurality of scan lines, each of the grid cells includes one of the first pixel units or one of the second pixel units.

In order to solve the above problems, in a second aspect, the present application provides a display panel, including a first display area, a second display area and a non-display area;

the non-display area and the second display area disposed adjacent to each other, the first display area surrounding the second display area and the non-display area, and the first display area including at least one first pixel unit, the second display area including at least one second pixel unit;

wherein an area of the second pixel unit is less than an area of the first pixel unit.

Wherein a center-to-center distance between two adjacent first pixel units is greater than a center-to-center distance between two adjacent second pixel units.

Wherein the second display area surrounds the non-display area, and the first display area surrounds the second display area.

Wherein the display panel includes a plurality of data lines and a plurality of scan lines, the plurality of scan lines are sequentially arranged along a first direction, the plurality of data lines are sequentially arranged along a second direction, a plurality of grid cells are formed by interlacing the plurality of data lines and the plurality of scan lines, each of the grid cells includes one of the first pixel units or one of the second pixel units.

Wherein the plurality of scan lines extend along the second direction in the first display area, and when extending to the non-display area, bypass the non-display area in a curved manner to be arranged in the second display area, the arrangement distance of the plurality of scan lines in the second display area is less than the arrangement distance of the plurality of scan lines in the first display area.

The plurality of data lines extend along the first direction in the first display area, and when extending to the non-display area, bypass the non-display area in a curved manner to be arranged in the second display area, the arrangement distance of the plurality of data lines in the second display area is less than the arrangement distance of the plurality of data lines in the first display area.

Wherein the display panel further includes a plurality of working voltage lines, the working voltage lines and the plurality of data lines are arranged side by side and are in one-to-one correspondence, the plurality of working voltage lines extend along the first direction in the first display area, and when extending to the non-display area, bypass the non-display area in a curved manner to be arranged in the second display area, the arrangement distance of the plurality of working voltage lines in the second display area is less than the arrangement distance of the plurality of working voltage lines in the first display area.

Wherein the second pixel unit includes a first transistor, a second transistor, a capacitor, and an organic light emitting device;

the first transistor includes a first gate, a first source, and a first drain, the second transistor includes a second gate, a second source, and a second drain;

the first source and a first pole of the capacitor are connected to the working voltage lines; the first drain is connected to the organic light emitting device, the first gate and a second pole of the capacitor are connected to the second drain;

the second gate is connected to the data lines, and the second source is connected to the scan lines.

Wherein the display panel includes a substrate, a water and oxygen barrier layer, a first insulating layer, a second insulating layer, a first dielectric layer, a second dielectric layer, a planarization layer, and an anode of the organic light emitting device, which are sequentially stacked;

the first source, the second source, the first drain, and the second drain are spaced apart between the second dielectric layer and the planarization layer, the water and oxygen barrier layer and the first insulating layer are provided with a first active layer and a second active layer which are spaced apart, the first source and the first drain are respectively connected to the first active layer, and the second source and the second drain are respectively connected to the second active layer;

the first drain is connected to the anode;

the first gate and the second gate are located between the first insulating layer and the second insulating layer;

a third gate is disposed between the second insulating layer and the first dielectric layer, and the first gate and the third gate constitute the capacitor.

Wherein a shape of the non-display area is any one of a circle, a rectangle, a triangle, and an ellipse, and an under-display camera is disposed correspondingly in the non-display area.

In order to solve the above problems, in a third aspect, the present application provides a display device, including the display panel according to anyone in the second aspect.

Beneficial Effect

Beneficial effect: the embodiment of this application provides a display panel, the display panel includes a first display area, a second display area, and a non-display area; the non-display area and the second display area are disposed adjacent to each other; the first display area surrounds the second display area and the non-display area; the first display area includes at least one first pixel unit; and the second display area includes at least one second pixel unit, wherein an area of the at least one second pixel unit is less than an area of the at least one first pixel unit. In the present application, the non-display area is disposed inside the display area, and by providing the at least one second pixel unit having a smaller area in the second display area to ensure the display effect of the second display area, the second display area at a boundary between the first display area and the non-display area can be fully utilized for display, thereby increasing the display area ratio of the display panel.

DESCRIPTION OF DRAWINGS

In order to more clearly illustrate the technical solutions in the embodiments of the present application, the drawings to be used in the embodiments will be briefly described below. It is obvious that the drawings in the following description are merely some of the embodiments of the present application, and other drawings may be obtained based on these figures by those skilled in the art without any creative work.

EMBODIMENTS OF THIS INVENTION

The technical solutions in the embodiments of the present application are clearly and completely described in the following with reference to the accompanying drawings in the embodiments of the present application. It is obvious that the described embodiments are only part of the embodiments of the application, and not all of the embodiments. All other embodiments obtained by those of ordinary skill in the art based on the embodiments of the present application are within the scope of the present application.

In the descriptions of the application, it is to be understood that orientation or positional relationships indicated by terms "center", "longitudinal", "transverse", "length", "width", "thickness", "upper", "lower", "front", "back", "left", "right", "vertical", "horizontal", "top", "bottom", "inner", "outer", and the like are orientation or positional relationships shown in the drawings. They are not to indicate or imply that indicated devices or components must be in specific orientations or structured and operated in specific orientations, but only to conveniently describe the application and simplify descriptions, so they should not be understood as limits to the application. In addition, terms "first" and "second" are only adopted for description and should not be understood to indicate or imply relative importance or implicitly indicate the number of indicated technical features. Therefore, a feature defined by "first" and "second" may explicitly or implicitly indicate inclusion of one or more such features. In the descriptions of the application, "multiple" means two or more than two, unless otherwise limited definitely and specifically.

In this application, the word "exemplary" is used herein to mean "serving as an example, instance, or illustration." Any embodiment described herein as "exemplary" is not necessarily to be construed as preferred or advantageous over other embodiments. The following description are provided to enable persons skilled in the art to realize and use the application. In the following description, details are set forth for the purpose of explanation. It will be appreciated that those skilled in the art will recognize that the present application can be practiced without these specific details. In other embodiments, well-known structures and processes are not described in detail to avoid unnecessary detail which makes a description of the present application obscure. Therefore, the application is not intended to be limited to the embodiments but is in accord with the broadest scope of the principles and features disclosed herein.

An embodiment of this application provides a display panel, the display panel includes a first display area, a second display area, and a non-display area; the non-display area and the second display area are disposed adjacent to each other; the first display area surrounds the second display area and the non-display area; the first display area includes at least one first pixel unit; and the second display area includes at least one second pixel unit, wherein an area of the at least one second pixel unit is less than an area of the at least one first pixel unit. The display panel in the embodiment of the present application can be applied in various display devices. The details are described below separately.

Figure 1:
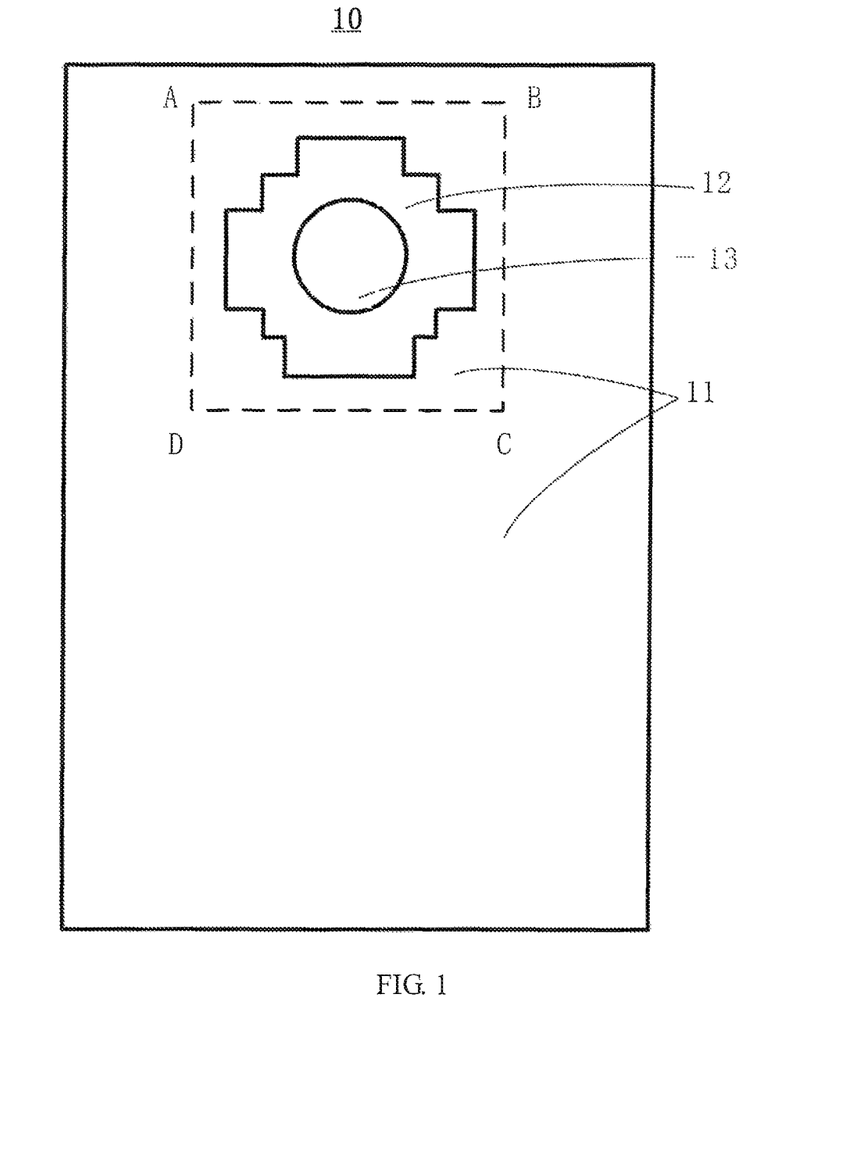
FIG. 1 is a schematic structural diagram of an embodiment of a display panel according to an embodiment of the present application.
Figure 2:
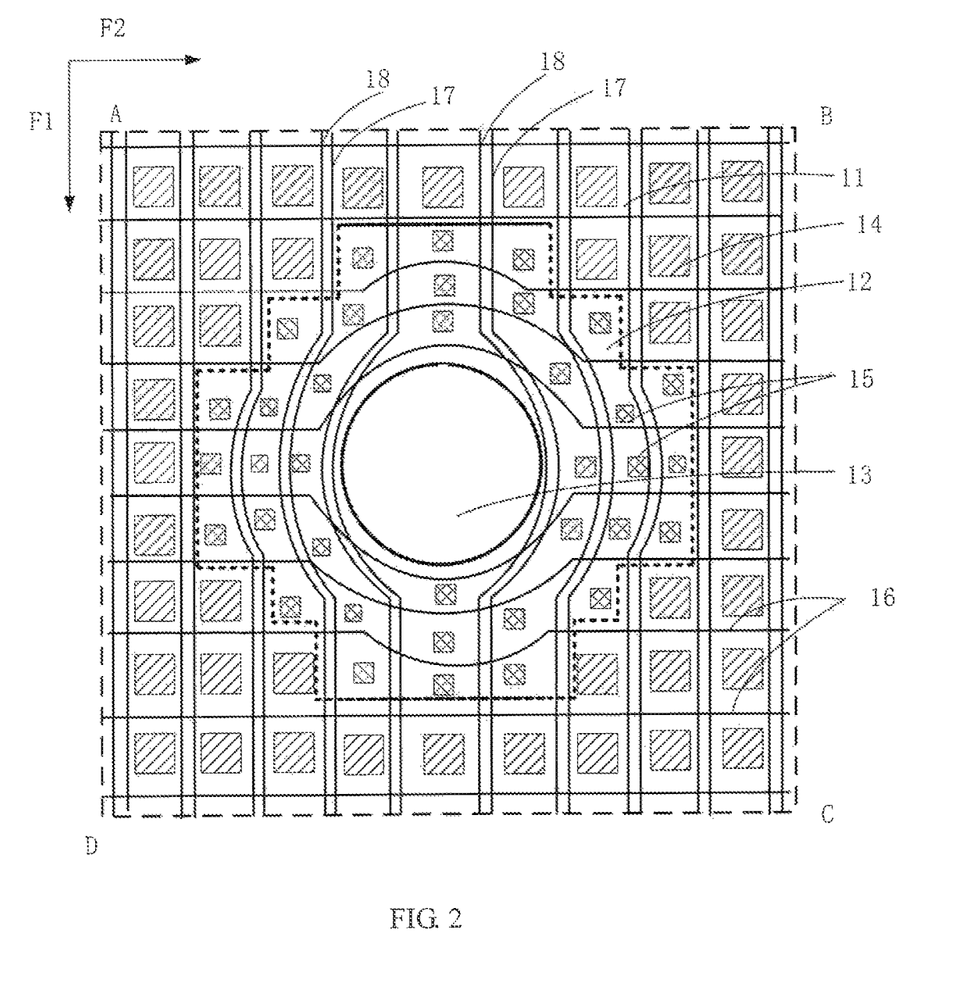
FIG. 2 is a schematic structural diagram of an embodiment of an area ABCD in the display panel in FIG. 1.
Figure 3:
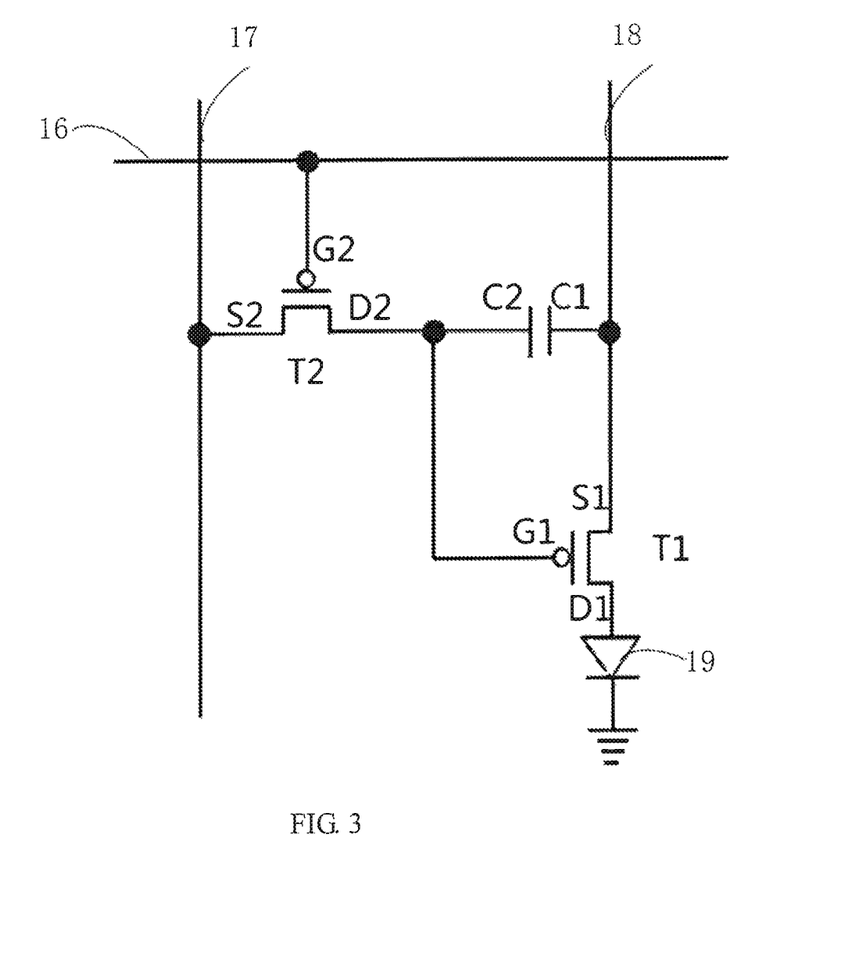
FIG. 3 is a schematic diagram showing a circuit structure of an embodiment of a second pixel unit in the display panel in FIG. 2.
Figure 4:
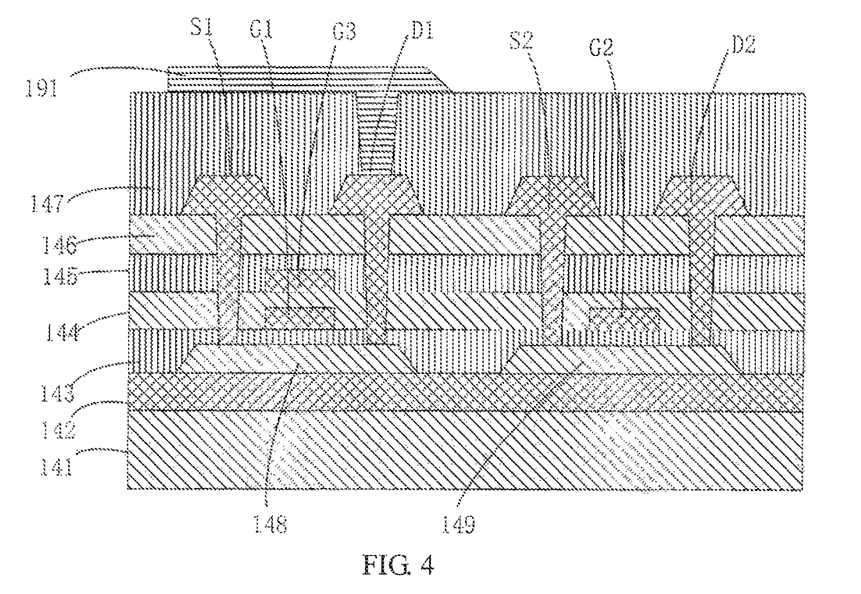
FIG. 4 is a schematic structural diagram of the embodiment of the second pixel unit in the display panel in FIG. 2.

Referring to FIG. 1 to FIG. 4, FIG. 1 is a schematic structural diagram of an embodiment of a display panel according to an embodiment of the present application; FIG. 2 is a schematic structural diagram of an embodiment of an area ABCD in the display panel in FIG. 1; FIG. 3 is a schematic diagram showing a circuit structure of an embodiment of a second pixel unit in the display panel in FIG. 2; and FIG. 4 is a schematic structural diagram of an embodiment of the second pixel unit in the display panel in FIG. 2.

In conjunction with FIG. 1 to FIG. 4, in the embodiment of the present application, a display panel 10 includes a first display area 11, a second display area 12, and a non-display area 13. The non-display area 13 and the second display area 12 are disposed adjacent to each other, and the first display area 11 surrounds the second display area 12 and the non-display area 13. The first display area 11 includes at least one first pixel unit 14, the second display area 12 includes at least one second pixel unit 15; wherein an area of the at least one second pixel unit 15 is less than an area of the at least one first pixel unit 14. Obviously, in the present application, the non-display area 13 is disposed inside a display area, and by providing the at least one second pixel unit 15 having a smaller area in the second display area 12 to ensure the display effect of the second display area 12, the second display area 12 at a boundary between the first display area 11 and the non-display area 13 can be fully utilized for display, thereby increasing the display area ratio of the display panel 10.

In a specific embodiment, a shape of the non-display area 13 is a circle, and an under-display camera is disposed correspondingly in the non-display area 13. The non-display area 13 may be used to accommodate other components. The shape of the non-display area 13 may also be other shapes such as a rectangle, an ellipse, and a triangle. The shape is determined according to the accommodated components, which is not limited in this application.

In a preferred embodiment, the second display area 12 surrounds the non-display area 13, and the first display area 11 surrounds the second display area 12. That is, the second display area 12 completely covers a periphery of the non-display area 13, and the at least one second pixel unit 15 having a smaller area is disposed on the periphery of the non-display area 13 to ensure the display effect of the second display area 12. The second display area 12 at the boundary between the first display area 11 and the non-display area 13 can be fully utilized for display, thereby increasing the display area ratio of the display panel 10.

Furthermore, a center-to-center distance between two adjacent first pixel units 14 is greater than a center-to-center distance between two adjacent second pixel units 15. The distance between the second pixel units 15 is shorter, so that the second pixel units 15 can be arranged more densely, thereby improving display effect of the second display area 12, and more fully utilizing the second display area 12 to increase the display area ratio of the display panel 10.

In the embodiment of the present application, the display panel 10 includes a plurality of data lines 17 and a plurality of scan lines 16. The plurality of scan lines 16 are sequentially arranged along a first direction F1, and the plurality of data lines 17 are sequentially arranged along a second direction F2. The first direction F1 is not parallel to the second direction F2. A plurality of grid cells are formed by interlacing the plurality of data lines 17 and the plurality of scan lines 16. Each of the grid cells includes one of the first pixel units 14 or one of the second pixel units 15. In a preferred embodiment, the first direction F1 is perpendicular to the second direction F2. The plurality of data lines 17 are used to input data signals to pixel units, and the plurality of scan lines 16 are used to input scan signals to the pixel units to cause the pixel units to display.

Specifically, the plurality of scan lines 16 extend along the second direction F2 in the first display area 11, and when extending to the non-display area 13, bypass the non-display area 13 in a curved manner to be arranged in the second display area 12. An arrangement distance of the plurality of scan lines 16 in the second display area 12 is less than an arrangement distance of the plurality of scan lines 16 in the first display area 11. That is, when the plurality of scan lines 16 pass through the non-display area 13, the non-display area 13 is bypassed, thereby preventing blockage of the non-display area 13, and facilitating optical signal, electric signal, acoustic signal, electromagnetic signal, etc. entering and exiting from the non-display area 13. For example, an under-display camera is disposed correspondingly in the non-display area 13, optical signal can more easily enter and exit from the non-display area 13, and imaging effect of the camera can be improved.

Furthermore, the plurality of data lines 17 extend along the first direction F1 in the first display area 11, and when extending to the non-display area 13, bypass the non-display area 13 in a curved manner to be arranged in the second display area 12. An arrangement distance of the plurality of data lines 17 in the second display area 12 is less than an arrangement distance of the plurality of data lines 17 in the first display area 11. That is, when the plurality of data lines 17 pass through the non-display area 13, the non-display area 13 is bypassed, thereby preventing blockage of the non-display area 13, and facilitating optical signal, electric signal, acoustic signal, electromagnetic signal, etc. entering and exiting from the non-display area 13.

Furthermore, the display panel 10 includes a plurality of working voltage lines 18. The working voltage lines 18 and the plurality of data lines 17 are arranged side by side and are in one-to-one correspondence. The plurality of working voltage lines 18 extend along the first direction F1 in the first display area 11, and when extending to the non-display area 13, bypass the non-display area 13 in a curved manner to be arranged in the second display area 12. An arrangement distance of the plurality of working voltage lines 18 in the second display area 12 is less than an arrangement distance of the plurality of working voltage lines 18 in the first display area 11. That is, when the plurality of working voltage lines 18 pass through the non-display area 13, the non-display area 13 is bypassed, thereby preventing blockage of the non-display area 13, and facilitating optical signal, electric signal, acoustic signal, electromagnetic signal, etc. entering and exiting from the non-display area 13.

In the embodiment of the present application, the at least one second pixel unit 15 includes a first transistor T1, a second transistor T2, a capacitor, and an organic light-emitting device 19. The first transistor T1 includes a first gate G1, a first source S1, and a first drain D1. The second transistor T2 includes a second gate G2, a second source S2, and a second drain D2. The first source S1 and a first pole C1 of the capacitor are connected to the working voltage lines 18; the first drain D1 is connected to the organic light-emitting device 19; the first gate G1 and a second pole C2 of the capacitor are connected to the second drain D2; the second gate G2 is connected to the data lines 17; and the second source S2 is connected to the scan lines 16.

In the embodiment of the present application, a circuit structure and a laminated structure of the at least one first pixel unit 14 may be the same as those of the at least one second pixel unit 15, or may be different from those of the at least one second pixel unit 15, which is not limited in this application.

In the embodiment of the present application, the display panel 10 includes a substrate 141, a water and oxygen barrier layer 142, a first insulating layer 143, a second insulating layer 144, a first dielectric layer 145, a second dielectric layer 146, a planarization layer 147, and an anode 191 of the organic light-emitting device 19, which are sequentially stacked. The first source S1, the second source S2, the first drain D1, and the second drain D2 are spaced apart between the second dielectric layer 146 and the planarization layer 147. The water and oxygen barrier layer 142 and the first insulating layer 143 are provided with a first active layer 148 and a second active layer 149, which are spaced apart; the first source S1 and the first drain D1 are respectively connected to the first active layer 148, and the second source S2 and the second drain D2 are respectively connected to the second active layer 149. The first drain D1 is connected to the anode 191. The first gate G1 and the second gate G2 are located between the first insulating layer 143 and the second insulating layer 144; a third gate G3 is disposed between the second insulating layer 144 and the first dielectric layer 145; and the first gate G1 and the third gate G3 constitute the capacitor, which is the first pole C1 of the capacitor and the second pole C2 of the capacitor, respectively.

Different from the prior art, the embodiment of the present application provides a display panel, the display panel includes a first display area, a second display area, and a non-display area; the non-display area and the second display area are disposed adjacent to each other; the first display area surrounds the second display area and the non-display area; the first display area includes at least one first pixel unit; and the second display area includes at least one second pixel unit, wherein an area of the at least one second pixel unit is less than an area of the at least one first pixel unit. In the present application, the non-display area is disposed inside the display area, and by providing the at least one second pixel unit having a smaller area in the second display area to ensure the display effect of the second display area, the second display area at a boundary between the first display area and the non-display area can be fully utilized for display, thereby increasing the display area ratio of the display panel.

It should be noted that in the above-mentioned embodiment of the display panel, only the above-mentioned structure is described. It can be understood that in addition to the above-mentioned structure, the display panel in the embodiment of the present application may include any other necessary structures as needed, and is not limited herein.

In specific implementation, each of the above units or structures may be implemented as a separate entity, or may be combined in any combination, as one or several entities. For the specific implementation of the above various units or structures, please refer to the foregoing method embodiments, and details are not described herein again.

For the specific implementation of the foregoing operations, please refer to the foregoing embodiments, and details are not described herein again.

A display panel and a display device provided by the embodiments of the present application are described in detail above, the specific examples are applied in this document to explain the principle and implementation of the application, and the description of the above embodiments is only for helping to understand the method of the present application and its core ideas. At the same time, those skilled in the art may make changes in the specific embodiment and the scope of application according to the idea of the present application. In summary, the content of this specification should not be construed as limiting the application.

What is claimed is:

1. A display panel, comprising:
   a first display area, a second display area, and a non-display area;
   the non-display area and the second display area are disposed adjacent to each other, the first display area surrounds the second display area and the non-display area, the first display area comprises at least one first pixel unit, and the second display area comprises at least one second pixel unit;
   wherein an area of the at least one second pixel unit is less than an area of the at least one first pixel unit;
   a center-to-center distance between two adjacent first pixel units is greater than a center-to-center distance between two adjacent second pixel units; and
   the second display area surrounds the non-display area, and the first display area surrounds the second display area.

2. The display panel as claimed in claim 1, wherein the display panel comprises a plurality of data lines and a plurality of scan lines, the plurality of scan lines are sequentially arranged along a first direction, the plurality of data lines are sequentially arranged along a second direction, a plurality of grid cells are formed by interlacing the plurality of data lines and the plurality of scan lines, and each of the grid cells comprises one of the first pixel units or one of the second pixel units.

3. A display panel, comprising:
   a first display area, a second display area, and a non-display area;
   the non-display area and the second display area are disposed adjacent to each other, the first display area surrounds the second display area and the non-display area, the first display area comprises at least one first pixel unit, and the second display area comprises at least one second pixel unit;
   wherein an area of the at least one second pixel unit is less than an area of the at least one first pixel unit.

4. The display panel as claimed in claim 3, wherein a center-to-center distance between two adjacent first pixel units is greater than a center-to-center distance between two adjacent second pixel units.

5. The display panel as claimed in claim 3, wherein the second display area surrounds the non-display area, and the first display area surrounds the second display area.

6. The display panel as claimed in claim 3, wherein the display panel comprises a plurality of data lines and a plurality of scan lines, the plurality of scan lines are sequentially arranged along a first direction, the plurality of data lines are sequentially arranged along a second direction, a plurality of grid cells are formed by interlacing the plurality of data lines and the plurality of scan lines, and each of the grid cells comprises one of the first pixel units or one of the second pixel units.

7. The display panel as claimed in claim 6, wherein the plurality of scan lines extend along the second direction in the first display area, and when extending to the non-display area, bypass the non-display area in a curved manner to be arranged in the second display area; an arrangement distance of the plurality of scan lines in the second display area is less than an arrangement distance of the plurality of scan lines in the first display area;
   the plurality of data lines extend along the first direction in the first display area, and when extending to the non-display area, bypass the non-display area in a curved manner to be arranged in the second display area; an arrangement distance of the plurality of data lines in the second display area is less than an arrangement distance of the plurality of data lines in the first display area.

8. The display panel as claimed in claim 7, wherein the display panel further comprises a plurality of working voltage lines, and the working voltage lines and the plurality of data lines are arranged side by side and are in one-to-one correspondence; the plurality of working voltage lines extend along the first direction in the first display area, and when extending to the non-display area, bypass the non-display area in a curved manner to be arranged in the second display area; an arrangement distance of the plurality of working voltage lines in the second display area is less than an arrangement distance of the plurality of working voltage lines in the first display area.

9. The display panel as claimed in claim 8, wherein the at least one second pixel unit comprises a first transistor, a second transistor, a capacitor, and an organic light-emitting device;
the first transistor comprises a first gate, a first source, and a first drain; the second transistor comprises a second gate, a second source, and a second drain;
the first source and a first pole of the capacitor are connected to the working voltage lines; the first drain is connected to the organic light-emitting device; the first gate and a second pole of the capacitor are connected to the second drain; and
the second gate is connected to the data lines, and the second source is connected to the scan lines.

10. The display panel as claimed in claim 9, wherein the display panel comprises a substrate, a water and oxygen barrier layer, a first insulating layer, a second insulating layer, a first dielectric layer, a second dielectric layer, a planarization layer, and an anode of the organic light-emitting device, which are sequentially stacked;
the first source, the second source, the first drain, and the second drain are spaced apart between the second dielectric layer and the planarization layer; the water and oxygen barrier layer and the first insulating layer are provided with a first active layer and a second active layer which are spaced apart; the first source and the first drain are respectively connected to the first active layer; the second source and the second drain are respectively connected to the second active layer;
the first drain is connected to the anode;
the first gate and the second gate are located between the first insulating layer and the second insulating layer; and
a third gate is disposed between the second insulating layer and the first dielectric layer, and the first gate and the third gate constitute the capacitor.

11. The display panel as claimed in claim 3, wherein a shape of the non-display area is any one of a circle, a rectangle, a triangle, and an ellipse, and an under-display camera is disposed correspondingly in the non-display area.

12. A display device, comprising:
a display panel, the display panel comprising a first display area, a second display area, and a non-display area;
the non-display area and the second display area are disposed adjacent to each other, the first display area surrounds the second display area and the non-display area, the first display area comprises at least one first pixel unit, and the second display area comprises at least one second pixel unit;
wherein an area of the at least one second pixel unit is less than an area of the at least one first pixel unit.

13. The display device as claimed in claim 12, wherein a center-to-center distance between two adjacent first pixel units is greater than a center-to-center distance between two adjacent second pixel units.

14. The display device as claimed in claim 12, wherein the second display area surrounds the non-display area, and the first display area surrounds the second display area.

15. The display device as claimed in claim 12, wherein the display panel comprises a plurality of data lines and a plurality of scan lines, the plurality of scan lines are sequentially arranged along a first direction, the plurality of data lines are sequentially arranged along a second direction, a plurality of grid cells are formed by interlacing the plurality of data lines and the plurality of scan lines, and each of the grid cells comprises one of the first pixel units or one of the second pixel units.

16. The display device as claimed in claim 15, wherein the plurality of scan lines extend along the second direction in the first display area, and when extending to the non-display area, bypass the non-display area in a curved manner to be arranged in the second display area; an arrangement distance of the plurality of scan lines in the second display area is less than an arrangement distance of the plurality of scan lines in the first display area;
the plurality of data lines extend along the first direction in the first display area, and when extending to the non-display area, bypass the non-display area in a curved manner to be arranged in the second display area; an arrangement distance of the plurality of data lines in the second display area is less than an arrangement distance of the plurality of data lines in the first display area.

17. The display device as claimed in claim 16, wherein the display panel further comprises a plurality of working voltage lines, and the working voltage lines and the plurality of data lines are arranged side by side and are in one-to-one correspondence; the plurality of working voltage lines extend along the first direction in the first display area, and when extending to the non-display area, bypass the non-display area in a curved manner to be arranged in the second display area; an arrangement distance of the plurality of working voltage lines in the second display area is less than an arrangement distance of the plurality of working voltage lines in the first display area.

18. The display device as claimed in claim 17, wherein the at least one second pixel unit comprises a first transistor, a second transistor, a capacitor, and an organic light-emitting device;
the first transistor comprises a first gate, a first source, and a first drain; the second transistor comprises a second gate, a second source, and a second drain;
the first source and a first pole of the capacitor are connected to the working voltage lines; the first drain is connected to the organic light-emitting device; the first gate and a second pole of the capacitor are connected to the second drain; and
the second gate is connected to the data lines, and the second source is connected to the scan lines.

19. The display device as claimed in claim 18, wherein the display panel comprises a substrate, a water and oxygen barrier layer, a first insulating layer, a second insulating layer, a first dielectric layer, a second dielectric layer, a planarization layer, and an anode of the organic light-emitting device, which are sequentially stacked;
the first source, the second source, the first drain, and the second drain are spaced apart between the second dielectric layer and the planarization layer; the water and oxygen barrier layer and the first insulating layer are provided with a first active layer and a second active layer, which are spaced apart; the first source and the first drain are respectively connected to the first active layer; the second source and the second drain are respectively connected to the second active layer;
the first drain is connected to the anode;
the first gate and the second gate are located between the first insulating layer and the second insulating layer; and a third gate is disposed between the second insulating layer and the first dielectric layer, and the first gate and the third gate constitute the capacitor.

20. The display device as claimed in claim 12, wherein a shape of the non-display area is any one of a circle, a rectangle, a triangle, and an ellipse, and an under-display camera is disposed correspondingly in the non-display area.

* * * * *